(12) United States Patent
Eggers et al.

(10) Patent No.: US 12,392,851 B2
(45) Date of Patent: Aug. 19, 2025

(54) DIXON-TYPE WATER/FAT SEPARATION MR IMAGING

(71) Applicant: KONINKLIJKE PHILIPS N.V., Eindhoven (NL)

(72) Inventors: Holger Eggers, Ellerhoop (DE); Peter Boernert, Hamburg (DE)

(73) Assignee: Koninklijke Philips N.V., Eindhoven (NL)

( * ) Notice: Subject to any disclaimer, the term of this patent is extended or adjusted under 35 U.S.C. 154(b) by 155 days.

(21) Appl. No.: 18/038,056

(22) PCT Filed: Dec. 2, 2021

(86) PCT No.: PCT/EP2021/083857
§ 371 (c)(1),
(2) Date: May 22, 2023

(87) PCT Pub. No.: WO2022/122518
PCT Pub. Date: Jun. 16, 2022

(65) Prior Publication Data
US 2023/0366962 A1 Nov. 16, 2023

(30) Foreign Application Priority Data
Dec. 8, 2020 (EP) .................................... 20212403

(51) Int. Cl.
*G01V 3/00* (2006.01)
*G01R 33/48* (2006.01)
(Continued)

(52) U.S. Cl.
CPC ..... *G01R 33/4828* (2013.01); *G01R 33/5608* (2013.01); *G01R 33/5617* (2013.01); *G01R 33/56518* (2013.01)

(58) Field of Classification Search
CPC .......................... G01R 33/5673; G01R 33/546
(Continued)

(56) References Cited

U.S. PATENT DOCUMENTS

| 9,983,284 B2 * | 5/2018 | Eggers ................... A61B 5/055 |
| 2002/0057086 A1 * | 5/2002 | Mueller ................ G01R 33/54 |
| | | 324/309 |

(Continued)

FOREIGN PATENT DOCUMENTS

| CN | 1683939 A | * | 10/2005 | ....... G01R 33/56341 |
| EP | 3413070 A1 | * | 12/2018 | ............. A61B 5/055 |

OTHER PUBLICATIONS

JP S6427545 A (No Name) (Year: 1989).*
(Continued)

*Primary Examiner* — Walter L Lindsay, Jr.
*Assistant Examiner* — Frederick Wenderoth

(57) ABSTRACT

The invention relates to a method of Dixon-type MR imaging. The object (10) is subjected to at least two shots of an imaging sequence, each shot comprising an excitation RF pulse followed by a series of refocusing RF pulses, wherein at least a pair of phase encoded echoes, a first echo at a first echo time and a second echo at a second echo time, is generated in each time interval between two consecutive refocusing RF pulses. Two sets of echo signal pairs, a first set and a second set, are acquired using bipolar pairs of readout magnetic gradients in two respective shots of the imaging sequence. The bipolar pair of readout magnetic field gradients in the acquisition of the second set has an opposite polarity to that of the bipolar pair of readout magnetic field gradients in the acquisition of the first set. Alternatively or additionally the temporal course of the readout magnetic field gradients in the acquisition of the second set is reversed with respect to the temporal course of the readout magnetic field gradients in the acquisition of the first set. Alternatively (Continued)

or additionally the acquisitions of the first and second sets are different from each other with respect to the gradient areas of magnetic field gradients in the readout direction (M) preceding respectively succeeding the bipolar pair of readout magnetic field gradients. Finally, an MR image is reconstructed from the acquired first and second sets of echo signal pairs, whereby signal contributions from water protons and fat protons are separated. Moreover the invention relates to an MR device (1) and to a computer program to be run on an MR device (1).

20 Claims, 4 Drawing Sheets

(51) Int. Cl.
    *G01R 33/56*     (2006.01)
    *G01R 33/561*     (2006.01)
    *G01R 33/565*     (2006.01)

(58) Field of Classification Search
    USPC .......................................................... 324/309
    See application file for complete search history.

(56) References Cited

U.S. PATENT DOCUMENTS

2008/0317315 A1* 12/2008 Stemmer .......... G01R 33/56509
                                              382/131

2011/0175613 A1* 7/2011 Shigeta .............. G01R 33/4824
                                              324/309
2016/0033605 A1   2/2016  Stemmer et al.
2020/0018809 A1   1/2020  Duijndam
2020/0132794 A1   4/2020  Eggers

OTHER PUBLICATIONS

Eggers et al "Dual Echo Dixon Imaging With Flexible Choice of Echo Times" Magnetic Resonance in Medicine vol. 65 p. 96-107 2011.
Ma et al "Fast Spin Echo Triple Echo Dixon Technique . . . " Magnetic Resonance in Medicine, vol. 58 p. 103-109 2007.
Ryden Hendric et al "Rare Two Point Dixon With Dual Bandwidths" Magnetic Resonance in Med. vol. 84, No. 5 Apr. 25, 2020 p. 2456-2468.
Li et al "Fast Decomposition of Water and Lipid Using a Grase Technique With the Ideal Algorithm" Magnetic Resonance in Med. vol. 57, No. 6 p. 1047-1057 (2007).
Cho et al "Technical Note: Interleaved Bipolar Acquisition and Low-Rank Reconstruction for Water-Fat Separation in MRI" Med. Phys.45 (7) Jul. 2018.
Lu et al "Water Fat Separation With Bipolar Multiecho Sequences" Magnetic Reson. in Med. 60 p. 198-209 (2008).
Soliman et al "Fat Quantification Using an Interleaved Bipolar Acquisition" Magnetic Resonance in Med. 75 p. 2000-2008 (2016).
International Search Report and Written Opinion from PCT/EP2021/083857 mailed Feb. 16, 2022.

* cited by examiner

DIXON-TYPE WATER/FAT SEPARATION MR IMAGING

CROSS REFERENCE TO RELATED APPLICATIONS

This application is a U.S. national phase application of International Application No. PCT/EP2021/083857 filed on Dec. 2, 2021, which claims the benefit of EP Application Serial No. 20212403.8 filed on Dec. 8, 2020 and is incorporated herein by reference.

FIELD OF THE INVENTION

The invention relates to the field of magnetic resonance (MR) imaging. It concerns a method of MR imaging of an object placed in the examination volume of an MR device. The invention also relates to an MR device and to a computer program to be run on an MR device.

BACKGROUND OF THE INVENTION

Image-forming MR methods which utilize the interaction between magnetic fields and nuclear spins in order to form two-dimensional or three-dimensional images are widely used nowadays, notably in the field of medical diagnostics, because for the imaging of soft tissue they are superior to other imaging methods in many respects, do not require ionizing radiation and are usually not invasive.

According to the MR method in general, the body of the patient to be examined is arranged in a strong, uniform magnetic field $B_0$ whose direction at the same time defines an axis (normally the z-axis) of the co-ordinate system on which the measurement is based. The magnetic field $B_0$ produces different energy levels for the individual nuclear spins in dependence on the magnetic field strength which can be excited (spin resonance) by application of an electromagnetic field (RF field) of defined frequency (Larmor frequency) in the radiofrequency range. From a macroscopic point of view the distribution of the individual nuclear spins produces an overall magnetization which can be deflected out of the state of equilibrium by application of an electromagnetic pulse of appropriate frequency (RF pulse) perpendicular to the z-axis, so that the magnetization performs a precessional motion about the z-axis. The precessional motion describes a surface of a cone whose angle of aperture is referred to as flip angle. The magnitude of the flip angle is dependent on the strength and the duration of the applied electromagnetic pulse. In the case of a so-called 90° pulse, the spins are deflected from the z-axis to the transverse plane (90° flip angle).

After termination of the RF pulse, the magnetization relaxes back to the original state of equilibrium, in which the magnetization in the z direction is built up again with a first time constant $T_1$ (spin-lattice or longitudinal relaxation time), and the magnetization in the direction perpendicular to the z direction relaxes with a second time constant $T_2$ (spin-spin or transverse relaxation time). The variation of the magnetization can be detected by means of receiving RF coils which are arranged and oriented within an examination volume of the MR device in such a manner that the variation of the magnetization is measured in the direction perpendicular to the z-axis. The decay of the transverse magnetization is accompanied, after application of, for example, a 90° pulse, by a transition of the nuclear spins (induced by local magnetic field inhomogeneities) from an ordered state with the same phase to a state in which the phase is uniformly distributed (dephasing). The dephasing can be compensated by means of a refocusing pulse (for example a 180° pulse). This produces an echo signal in the receiving coils.

In order to realize spatial resolution in the body, constant magnetic field gradients extending along the three main axes are superposed on the uniform magnetic field $B_0$, leading to a linear spatial dependency of the Larmor frequency. The signal picked up in the receiving coils then contains components of different frequencies which can be associated with different locations in the body. The signal data obtained via the receiving coils correspond to the spatial frequency domain and are called k-space data. The k-space data usually include data from multiple lines in k-space, acquired with different phase encoding. Each k-space line is digitized by collecting a number of samples. A set of samples from multiple lines in k-space is converted to an MR image, e.g., by means of Fourier transformation.

In MR imaging, it is often desired to obtain information about the relative contribution of water and fat to the overall signal, either to suppress the contribution of one of them or to separately or jointly analyse the contribution of both of them. These contributions can be calculated if information from two or more corresponding echoes, acquired at different echo times (with respect to excitation or spin echo refocussing), is combined. This may be considered as chemical shift encoding, in which an additional dimension, the chemical shift dimension, is defined and encoded by acquiring two or more MR images at slightly different echo times. For water/fat separation, these types of experiments are often referred to as Dixon-type measurements. By means of Dixon MR imaging or Dixon water/fat MR imaging, a water/fat separation is achieved by calculating contributions of water and fat from two or more corresponding echoes, acquired at different echo times. In general such a separation is possible because there is a known precessional frequency difference of hydrogen in water and fat. In its simplest form, water and fat images are generated by either addition or subtraction of the in-phase and out-of-phase datasets.

Several Dixon-type MR imaging methods have been proposed in recent years. Apart from different strategies for the water/fat separation, the known techniques are mainly characterized by the specific number of echoes (points) they acquire and by the constraints that they impose on the used echo times. Conventional so-called two- and three-point methods require in-phase and opposed-phase echo times at which the water and fat signals are parallel and anti-parallel in the complex plane, respectively. Three-point methods have gradually been generalized to allow flexible echo times. Thus, they do not restrict the angle or phase between the water and fat signals at the echo times to certain values anymore. In this way, they provide more freedom in imaging sequence design and enable in particular a trade-off between signal-to-noise ratio (SNR) gains from the acquisition and SNR losses in the separation. Sampling only two instead of three echoes is desirable to reduce scan time. However, constraints on the echo times may actually render dual-echo acquisitions slower than triple-echo acquisitions. Eggers et al. (Magnetic Resonance in Medicine, 65, 96-107, 2011) have proposed a flexible dual-echo Dixon-type MR imaging method which enables the elimination of such constraints. Using such Dixon-type MR imaging methods with more flexible echo times, in-phase and opposed-phase images are no longer necessarily acquired, but optionally synthesized from water and fat images.

Dixon-type MR imaging methods are often applied in combination with fast (turbo) spin echo sequences using a multi-repetition approach. Typically, two or three interleaved measurements with shifted readout magnetic field gradients and acquisition windows are employed. In FIG. 2, a schematic pulse sequence diagram of a conventional turbo spin echo (TSE) Dixon sequence is depicted. The diagram shows switched magnetic field gradients in the frequency-encoding direction (M), the phase-encoding direction (P) and the slice-selection direction (S). Moreover, the diagram shows RF excitation and refocusing pulses as well as the time intervals during which echo signals are acquired, designated by ACQ. The diagram covers the acquisition of the first three echo signals of one shot of the imaging sequence. The double arrows indicate the shifting of the readout magnetic field gradients (top) and the acquisition windows ACQ (bottom) between multiple repetitions of one shot with identical phase encoding. According to the shifting of the readout magnetic field gradients, different phase offsets of the signal contributions from water protons and fat protons, respectively, are obtained on which the Dixon-type water/fat separation is based.

In comparison to standard (non-Dixon) TSE sequences, Dixon TSE techniques provide superior fat suppression and multiple contrasts in a single acquisition. However, because of the required multiple repetitions of each shot with identical phase encoding, scan time increases. Moreover, scan efficiency decreases due to the dead times introduced to permit shifting the readout magnetic field gradients and the acquisition windows. Alternatively, the echo spacing increases, and longer or more echo trains are needed. This results in less coverage and more blurring in the reconstructed MR images, or again in longer scan time.

Alternatively, a multi-echo approach is pursued, acquiring two or three echoes instead of one echo after each RF refocusing pulse. Ma et al. (Magnetic Resonance in Medicine, 58, 103-109, 2007) describe a triple-echo Dixon TSE technique, in which three echo signals are generated in each time interval between two consecutive refocusing RF pulses. The echo signals are acquired using a bipolar triplet of readout magnetic field gradients in order to reduce the temporal spacing between these three echo signals and thus the time interval between two consecutive refocusing RF pulses and the $T_2$ decay over the echo trains. FIG. 3 shows an example of this approach. A pulse sequence diagram of a triple-echo Dixon TSE sequence is depicted, covering the acquisition of the first two echo signal triplets of one shot. Three gradient-recalled echoes are acquired after each RF refocusing pulse. The bipolar triplet of readout magnetic field gradients is preceded and succeeded by spoiler readout magnetic field gradients. The vertical dashed lines indicate the different echo times.

A dual-echo Dixon TSE technique, in which only two echo signals are generated in each time interval between two consecutive refocusing RF pulses is known. Moreover, the echo signals are only partially acquired using a bipolar pair of readout magnetic field gradients in order to reduce the temporal spacing between these two echo signals and further reduce the time interval between two consecutive refocusing RF pulses and the $T_2$ decay over the echo trains. The bipolar pair of readout magnetic field gradients is preceded by a spoiler readout magnetic field gradient and succeeded by a fly-back and spoiler readout magnetic field gradient.

In order to be efficient, the multi-echo approach has to rely on bipolar readout magnetic field gradients as shown in FIG. 3. This entails that off-resonance effects, due to chemical shift or inhomogeneity of the main magnetic field $B_0$, lead to distortions in opposite directions in the resulting single-echo images. In addition, eddy currents cause phase errors between the single-echo images. Moreover, as the multi-echo approach often needs to employ partial echo sampling, especially at higher main magnetic field strengths, corrections become difficult or impossible, and image quality is adversely affected.

A dual-echo Dixon TSE technique in which only two echoes are acquired in the time interval between successive refocusing pulses is known.

SUMMARY OF THE INVENTION

It is an object of the invention to provide a method that enables a further improved Dixon water/fat separation in combination with a TSE acquisition.

In accordance with the invention, a method of MR imaging of an object placed in an examination volume of an MR device is disclosed. The method comprises the steps of:
  subjecting the object (10) to at least two shots of an imaging sequence, each shot comprising an excitation RF pulse followed by a series of refocusing RF pulses, wherein at least a pair of phase encoded echoes, a first echo at a first echo time and a second echo at a second echo time, is generated in each time interval between two consecutive refocusing RF pulses,
  acquiring a first set of echo signal pairs from the object (10) in a first shot of the imaging sequence using a bipolar pair of readout magnetic field gradients in each repetition interval,
  acquiring a second set of echo signal pairs from the object (10) in a second shot of the imaging sequence using a bipolar pair of readout magnetic field gradients in each repetition interval,
  wherein the bipolar pair of readout magnetic field gradients in the acquisition of the second set has an opposite polarity to that of the bipolar pair of readout magnetic field gradients in the acquisition of the first set, and/or the temporal course of the readout magnetic field gradients in the acquisition of the second set is reversed with respect to the temporal course of the readout magnetic field gradients in the acquisition of the first set, and/or the acquisitions of the first and second sets are different from each other with respect to the gradient areas of magnetic field gradients in the readout direction (M) preceding respectively succeeding the bipolar pair of readout magnetic field gradients, and
  reconstructing an MR image from the acquired first and second sets of echo signal pairs, whereby signal contributions from water protons and fat protons are separated.

According to the invention, two instances (shots) of a dual-echo TSE Dixon imaging sequence are used, each acquiring two echo signals in each interval between two refocusing RF pulses using bipolar pairs of readout magnetic field gradients. In general, each instance can comprise multiple shots, and each shot can acquire more than two echo signals. However, for the sake of simplicity, each instance is assumed to comprise one shot and each shot is assumed to acquire two echo signals henceforth. The phase encoding of the echo signals is chosen such that each of the acquired first and second sets covers the required region of k-space. The invention thus proposes to combine the above-described multi-repetition and multi-echo approaches. By performing two instances of the bipolar dual-echo acquisition, with opposite polarity of the bipolar pair of readout magnetic field gradients and/or with a reversed temporal course of the readout magnetic field gradients and/or with gradient area (the area under the temporal course of the magnetic field gradient) shifted between the spoiler, flyback, and/or dephasing readout magnetic field gradients preceding and succeeding the bipolar pair of readout magnetic field gradients, a high acquisition duty cycle is attained, and high image quality is retained by facilitating suppression of artefacts arising from the bipolar acquisitions. That is, the reconstruction includes suppression or elimination of artefacts that may arise from the bipolar readouts. More in particular, the read-out repetitions at opposite polarities of the bipolar gradient lobes provide for phase information due to eddy current effects. This phase information is employed in the reconstruction to eliminate at least in part eddy current effects due to the gradient switching of the bipolar read-outs. The reversal of the time course of the read-out field pulses improves the conditioning of the water/fat separation due to the different echo times, and water/fat separation artefacts and/or noise amplification can be reduced or even eliminated. These aspects may be incorporated in the reconstruction. The difference with respect to the gradient areas of magnetic field gradients in the readout direction (M) preceding respectively succeeding the bipolar pairs improves overall coverage of k-space, especially for partial echo acquisitions. This improves the effective coverage of k-space and improves conditioning of the reconstruction's conjugate symmetry problem.

In a preferred embodiment, some or all echo signals of the first set and/or the second set are acquired only partially. This means that k-space is sampled only partially in either the positive or negative readout direction of k-space. Both echoes may be sampled only partially towards the centre of the repetition interval between two successive refocusing RF pulses, meaning that, e.g., the first echo is sampled in the front of the echo, i.e. only partially in the positive readout direction, and the second echo is sampled in the back of the echo, i.e. only partially in the negative readout direction of k-space. In this way, smaller differences in the echo shifts can be obtained, which is particularly beneficial at higher main magnetic field strengths (3 T or more). Moreover, the interval between two successive refocusing RF pulses can be shortened to reduce scan time and $T_2$ decay over the echo trains.

In a further preferred embodiment, the reconstruction of the MR image involves the reconstruction of single-echo images from the acquired echo signal pairs, namely a first single-echo image attributed to the first echo time and a second single-echo image attributed to the second echo time, for each of the first and second sets. Eddy current-induced phase errors can then be eliminated by aligning the pixel- or voxel-wise phase of the first single-echo images of the first and second sets, and by aligning the pixel- or voxel-wise phase of the second single-echo images of the first and second sets respectively. This primarily applies when the bipolar pair of readout magnetic field gradients in the acquisition of the second set has an opposite polarity to that of the bipolar pair of readout magnetic field gradients in the acquisition of the first set, since the first and second echo times are in this case identical for the two sets. The thus corrected single-echo images can then be used for water/fat separation in the further image reconstruction procedure. This preferably involves a first water/fat separation based on the first single-echo image of the first set and one single-echo image of the second set resulting in a first water image and a first fat image, and a second water/fat separation based on the second single-echo image of the first set and the other single-echo image of the second set resulting in a second water image and a second fat image. The water/fat separations are advantageously performed based on single-echo images in the acquisition of which the readout magnetic field gradients had the same polarity. In this way, the fat shift and $B_0$ distortions can be ignored in this step. Finally, the first and second water images are combined into a final water image, and/or the first and second and fat images are combined into a final fat image. To this end, e.g., the fat images are registered with the water images and the $B_0$ distortions are corrected using a $B_0$ map estimated by the water/fat separation.

Additionally, reversing the temporal course of the readout magnetic field gradients in the acquisition of the second set with respect to the temporal course of the readout magnetic field gradients in the acquisition of the first set and/or shifting gradient area between the spoiler, fly-back, and/or dephasing readout magnetic field gradients preceding and succeeding the bipolar pair of readout magnetic field gradients allows modifying the echo shifts between the acquisition of the first and the second set of echo signal pairs. In this way, the conditioning of the inverse problem associated with the water/fat separation can be improved and water/fat separation artefacts and/or noise amplification can be reduced or even eliminated. This primarily applies when the water/fat separations are performed in k-space to correct for the fat shift.

The method of the invention described thus far can be carried out by means of an MR device including at least one main magnet coil for generating an essentially uniform, static magnetic field $B_0$ within an examination volume, a number of gradient coils for generating switched magnetic field gradients in different spatial directions within the examination volume, at least one body RF coil for generating RF pulses within the examination volume and/or for receiving MR signals from a body of a patient positioned in the examination volume, a control unit for controlling the temporal succession of RF pulses and switched magnetic field gradients, and a reconstruction unit for reconstructing MR images from the received MR signals. The method of the invention can be implemented by a corresponding programming of the reconstruction unit and/or the control unit of the MR device.

The method of the invention can be advantageously carried out on most MR devices in clinical use at present. To this end it is merely necessary to utilize a computer program by which the MR device is controlled such that it performs the above-explained method steps of the invention. The computer program may be present either on a data carrier or be present in a data network so as to be downloaded for installation in the control unit of the MR device.

BRIEF DESCRIPTION OF THE DRAWINGS

The enclosed drawings disclose preferred embodiments of the present invention. It should be understood, however, that the drawings are designed for the purpose of illustration only and not as a definition of the limits of the invention. In the drawings.

DETAILED DESCRIPTION OF THE EMBODIMENTS

Figure 1:
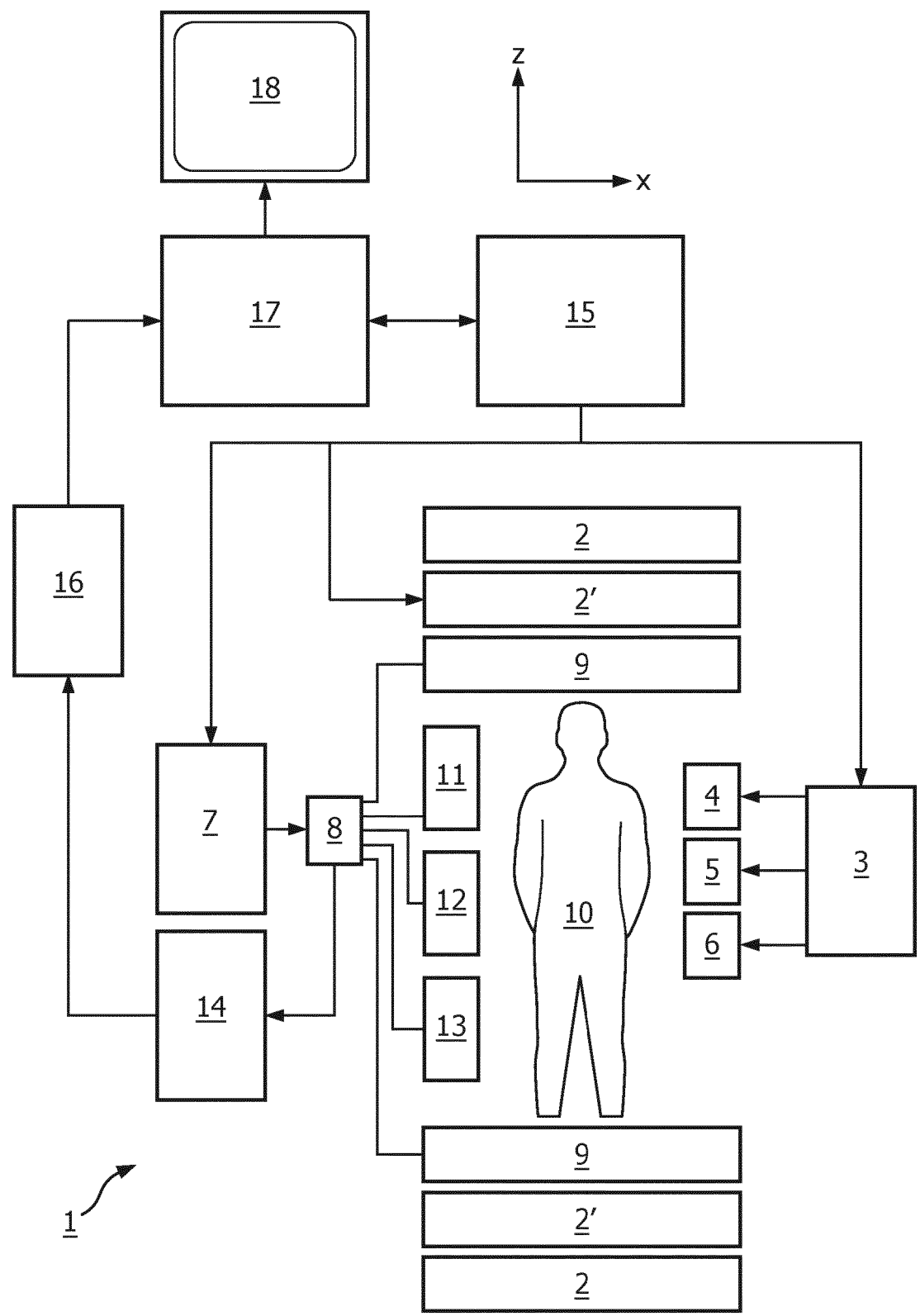
FIG. 1 shows an MR device for carrying out the method of the invention.
Figure 2:
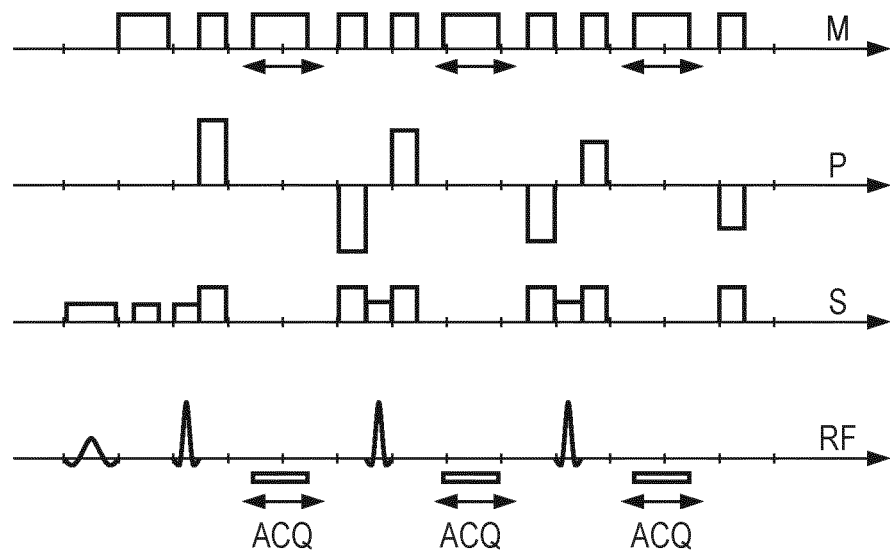
FIG. 2 shows a schematic (simplified) pulse sequence diagram of a conventional multi-repetition TSE Dixon imaging sequence.
Figure 3:
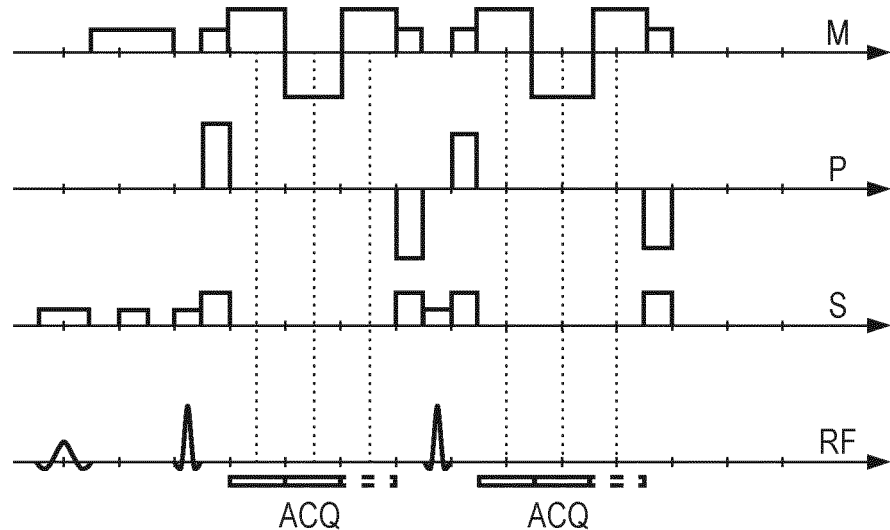
FIG. 3 shows a schematic (simplified) pulse sequence diagram of a conventional multi-echo TSE Dixon imaging sequence using bipolar readout magnetic field gradients.

With reference to FIG. 1, an MR device 1 is shown as a block diagram. The device comprises superconducting or resistive main magnet coils 2 such that a substantially uniform, temporally constant main magnetic field $B_0$ is created along a z-axis through an examination volume. The device further comprises a set of ($1^{st}$, $2^{nd}$ and—where applicable—$3^{rd}$ order) shimming coils 2', wherein the current flow through the individual shimming coils of the set 2' is controllable for the purpose of minimizing $B_0$ deviations within the examination volume.

A magnetic resonance generation and manipulation system applies a series of RF pulses and switched magnetic field gradients to invert, excite, saturate, refocus, and spatially and otherwise encode the magnetic resonance to perform MR imaging.

More specifically, a gradient pulse amplifier 3 applies current pulses to selected ones of whole-body gradient coils 4, 5 and 6 along x, y and z-axes of the examination volume. A digital RF frequency transmitter 7 transmits RF pulses or pulse packets, via a send/receive switch 8, to a body RF coil 9 to transmit RF pulses into the examination volume. A typical MR imaging sequence is composed of a packet of RF pulse segments of short duration which, together with any applied magnetic field gradients, achieve a selected manipulation of nuclear magnetic resonance. In particular, the RF pulses select a portion of a body 10 positioned in the examination volume. The MR signals are also picked up by the body RF coil 9.

For generation of MR images of limited regions of the body 10, a set of local array RF coils 11, 12, 13 are placed contiguous to the region selected for imaging. The array coils 11, 12, 13 can be used to receive MR signals induced by transmissions of the body RF coil.

The resultant MR signals are picked up by the body RF coil 9 and/or by the array RF coils 11, 12, 13 and demodulated by a receiver 14 preferably including a preamplifier (not shown). The receiver 14 is connected to the RF coils 9, 11, 12 and 13 via the send/receive switch 8.

A host computer 15 controls the shimming coils 2' as well as the gradient pulse amplifier 3 and the transmitter 7 to generate the imaging sequences of the invention. For the selected sequence, the receiver 14 receives signal data from a single or a plurality of k-space lines in rapid succession following each RF excitation pulse. A data acquisition system 16 performs analog-to-digital conversion of the received signals and converts each k-space line to a digital format suitable for further processing. In modern MR devices the data acquisition system 16 is a separate computer which is specialized in acquisition of raw image data.

Ultimately, the digital raw image data are reconstructed into an image representation by a reconstruction processor 17 which applies a Fourier transform or other appropriate reconstruction algorithms, such as SENSE. The MR image may represent a planar slice through the patient, an array of parallel planar slices, a three-dimensional volume, or the like. The image is then stored in an image memory where it may be accessed for converting slices, projections, or other portions of the image representation into appropriate format for visualization, for example via a video monitor 18 which provides a man-readable display of the resultant MR image.

The host computer 15 and the reconstruction processor 17 are arranged, by corresponding programming, to perform the method of the invention described herein above and in the following.

Figure 4:
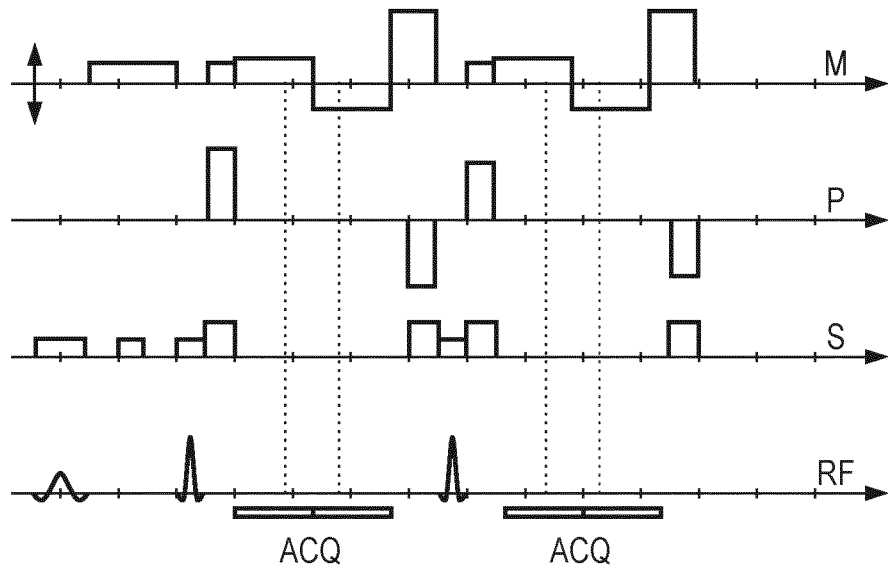
FIG. 4 shows a schematic (simplified) pulse sequence diagram according to a first embodiment of the invention.

According to the invention, two instances (shots) of a dual-echo TSE Dixon imaging sequence are used, each acquiring two echo signals in each interval between two refocusing RF pulses using a bipolar pair of readout magnetic field gradients. FIG. 4 shows a pulse sequence diagram of a dual-echo TSE sequence constituting an imaging sequence according to the invention. The diagram shows switched magnetic field gradients in the frequency-encoding direction (M), the phase-encoding direction (P) and the slice-selection direction (S). Moreover, the diagram shows the RF excitation and refocusing pulses as well as the time intervals during which echo signals are acquired, designated by ACQ. A pair of echo signals is acquired in each time interval between two consecutive refocusing RF pulses using a bipolar pair of readout magnetic field gradients. FIG. 4 covers the first two pairs of echo signals of one shot of the imaging sequence. By performing two shots of the imaging sequence with the polarity of the bipolar readout magnetic field gradients reversed between the shots (indicated by the double arrow in FIG. 4) a high acquisition duty cycle is attained, and high image quality is retained by facilitating suppression of artefacts arising from the bipolar acquisitions (for details see description above). In general, the phase encoding in the two shots does not need to be identical. Advanced parallel imaging and/or compressed sensing sub-sampling and reconstruction techniques can advantageously be applied in this case.

Figure 5:
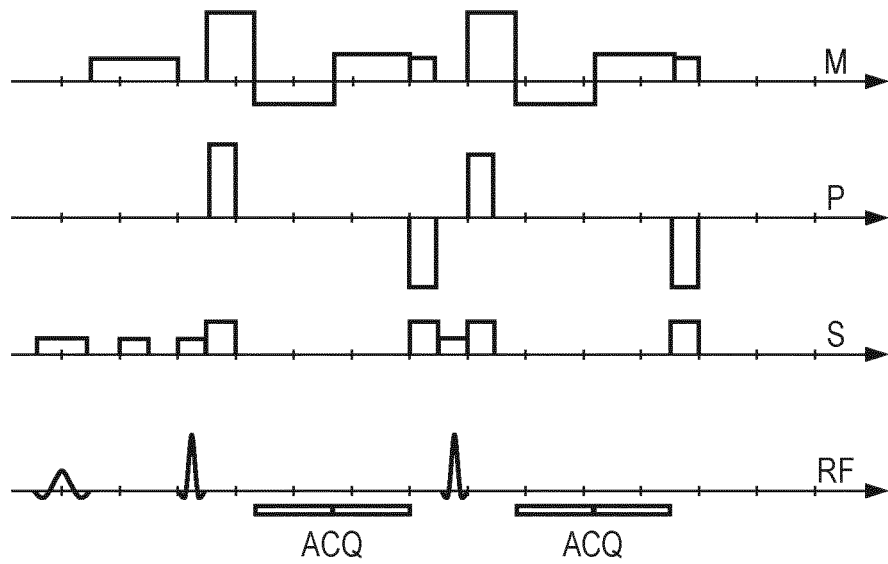
FIG. 5 shows a schematic (simplified) pulse sequence diagram according to a second embodiment of the invention.

Alternatively, or additionally, the temporal course of the readout magnetic field gradients (i.e. the sequence or order of the individual readout magnetic field gradient pulses) can be reversed in the second shot. This is illustrated in FIG. 5. The pulse sequence diagram of FIG. 5 is identical to that FIG. 4, except for the temporal course of the readout magnetic field gradients in the frequency-encoding direction (M) which is reversed in the second shot as shown in FIG. 5 with respect to the first shot as shown in FIG. 4.

Figure 6:
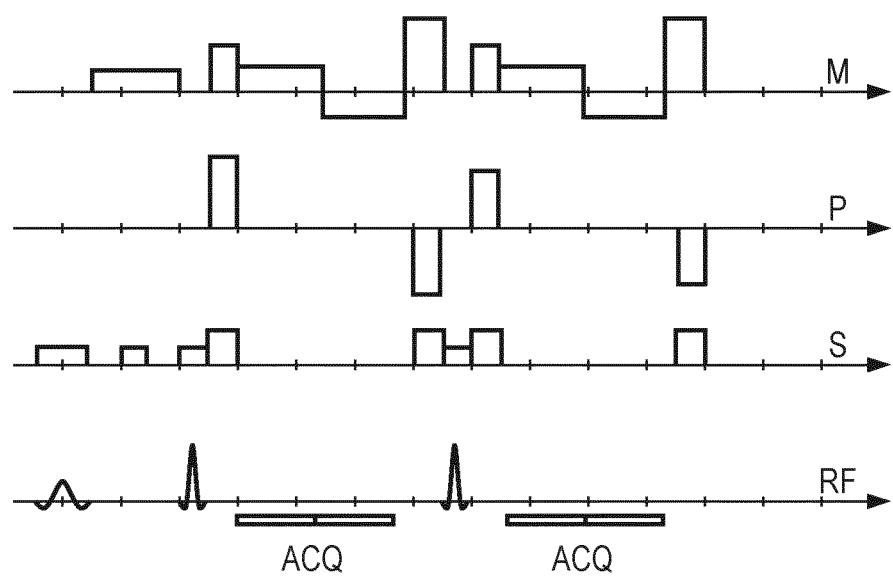
FIG. 6 shows a schematic (simplified) pulse sequence diagram according to a third embodiment of the invention.

Alternatively, or additionally, the gradient areas of the readout magnetic field gradients other than the bipolar pair can be varied between the first and the second shot, while keeping the sum of these gradient areas fixed. This is illustrated in FIG. 6. The pulse sequence diagram of FIG. 6 is identical to that of FIG. 4, except for the gradient area being shifted from the spoiler and fly-back readout magnetic field gradient succeeding the bipolar pair of readout magnetic field gradients to the spoiler readout magnetic field gradient preceding the bipolar pair of readout magnetic field gradients. Moreover, an optional, minor optimization of the timing was carried out, leading to slightly longer acquisition windows.

The invention claimed is:

1. A method of magnetic resonance (MR) imaging of an object placed in an examination volume of an MR device, the method comprising:
subjecting the object to at least two shots of an imaging sequence, each shot comprising an excitation RF pulse followed by a series of refocusing RF pulses, wherein at least a pair of phase encoded echoes, a first echo at a first echo time and a second echo at a second echo time, is generated in each time interval between two consecutive refocusing RF pulses;

acquiring a first set of echo signal pairs from the object in a first shot of the imaging sequence using a bipolar pair of readout magnetic field gradients in each repetition interval;

acquiring a second set of echo signal pairs from the object in a second shot of the imaging sequence using a bipolar pair of readout magnetic field gradients in each repetition interval, wherein in a readout direction (M), the magnetic field gradients between consecutive refocusing RF pulses of the second shot differ from those of the first shot; and arranging reconstruction of a first single-echo image attributed to the first echo time and a second single-echo image attributed to the second echo time for each of the first and second sets, whereby signal contributions from water protons and fat protons are separated and wherein the reconstruction includes suppression or elimination of artefacts that may arise from the bipolar acquisitions, wherein eddy-induced currents are eliminated by aligning a pixel-wise or a voxel-wise phase of the first single-echo images of the first and second sets, and by aligning the pixel-wise or the voxel-wise phase of the second single-echo images of the first and second sets.

2. A magnetic resonance (MR) device, comprising:

at least one main magnet coil adapted to generate a uniform, static magnetic field $B_0$ within an examination volume;

a number of gradient coils adapted to generate switched magnetic field gradients in different spatial directions within the examination volume;

at least one RF coil adapted to generate RF pulses within the examination volume and/or for receiving MR signals from an object positioned in the examination volume, a control unit for controlling a temporal succession of RF pulses and switched magnetic field gradients;

a reconstruction processor adapted to reconstruct MR images from the received MR signals;

a computer; and a tangible, non-transitory computer readable medium that stores computer executable code, which when executed by the computer, causes the computer to:

subject the object to at least two shots of an imaging sequence, each shot comprising an excitation RF pulse followed by a series of refocusing RF pulses, wherein at least a pair of phase encoded echoes, a first echo at a first echo time and a second echo at a second echo time, is generated in each time interval between two consecutive refocusing RF pulses;

acquire a first set of echo signal pairs from the object in a first shot of the imaging sequence using a bipolar pair of readout magnetic field gradients in each repetition interval;

acquire a second set of echo signal pairs from the object in a second shot of the imaging sequence using a bipolar pair of readout magnetic field gradients in each repetition interval, wherein in a readout direction (M), the magnetic field gradients between consecutive refocusing RF pulses of the second shot differ from those of the first shot; and arrange reconstruction of a first single-echo image attributed to the first echo time and a second single-echo image attributed to the second echo time for each of the first and second sets, whereby signal contributions from water protons and fat protons are separated and wherein the reconstruction includes suppression or elimination of artefacts that may arise from the bipolar acquisitions, wherein eddy-induced currents are eliminated by aligning a pixel-wise or a voxel-wise phase of the first single-echo images of the first and second sets, and by aligning the pixel-wise or the voxel-wise phase of the second single-echo images of the first and second sets.

3. A tangible, non-transitory computer readable medium that stores a stores computer executable code, which when executed by a computer, causes the computer to:

subject an object to at least two shots of an imaging sequence, each shot comprising an excitation RF pulse followed by a series of refocusing RF pulses, wherein at least a pair of phase encoded echoes, a first echo at a first echo time and a second echo at a second echo time, is generated in each time interval between two consecutive refocusing RF pulses;

acquire a first set of echo signal pairs from the object in a first shot of the imaging sequence using a bipolar pair of readout magnetic field gradients in each repetition interval;

acquire a second set of echo signal pairs from the object in a second shot of the imaging sequence using a bipolar pair of readout magnetic field gradients in each repetition interval, wherein in a readout direction (M), the magnetic field gradients between consecutive refocusing RF pulses of the second shot differ from those of the first shot; and arrange reconstruction of a first single-echo image attributed to the first echo time and a second single-echo image attributed to the second echo time for each of the first and second sets, whereby signal contributions from water protons and fat protons are separated and wherein the reconstruction includes suppression or elimination of artefacts that may arise from the bipolar acquisitions, wherein eddy-induced currents are eliminated by aligning a pixel-wise or a voxel-wise phase of the first single-echo images of the first and second sets, and by aligning the pixel-wise or the voxel-wise phase of the second single-echo images of the first and second sets.

4. The method of claim 1, wherein the readout magnetic field gradients between consecutive refocusing RF pulses of the second shot differ from those of the first show in that the bipolar pair of readout magnetic field gradients in the acquisition of the first set.

5. The method of claim 1, wherein the readout magnetic field gradients between consecutive refocusing RF pulses of the second shot differ from those of the first shot in that a temporal course of the readout magnetic field gradients in the acquisition of the second set is reversed with respect to the temporal course of the readout magnetic field gradients in the acquisition of the first set.

6. The MR device of claim 2, wherein the readout magnetic field gradients between consecutive refocusing RF pulses of the second shot differ from those of the first show in that the bipolar pair of readout magnetic field gradients in the acquisition of the first set.

7. The MR device of claim 2, wherein readout magnetic field gradients between consecutive refocusing RF pulses of the second shot differ from those of the first shot in that a temporal course of the readout magnetic field gradients in the acquisition of the second set is reversed with respect to the temporal course of the readout magnetic field gradients in the acquisition of the first set.

8. The tangible, non-transitory computer readable medium of claim 3, wherein at least one of the echo signals of the first set or the second set are acquired only partially.

9. The tangible, non-transitory computer readable medium of claim 3, wherein the reconstruction of an MR image comprises the reconstruction of single-echo images from the acquired echo signal pairs, namely a first single-echo image attributed to the first echo time and a second single-echo image attributed to the second echo time, for each of the first and second sets.

10. The tangible, non-transitory computer readable medium of claim 3, wherein eddy current-induced phase errors are eliminated by aligning the pixel-wise or voxel-wise phase of the first single-echo images of the first and second sets, and by aligning the pixel-wise or voxel-wise phase of the second single-echo images of the first and second sets.

11. The tangible, non-transitory computer readable medium of claim 3, wherein the reconstruction of an MR image involves a first water/fat separation based on the first single-echo image of the first set and one single-echo image of the second set resulting in a first water image and a first fat image, and a second water/fat separation based on the second single-echo image of the first set and the other single-echo image of the second set resulting in a second water image and a second fat image.

12. The method of claim 5, wherein the readout magnetic field gradients between consecutive refocusing RF pulses of the second shot differ from those of the first shot in gradient areas of magnetic field gradients in the readout direction (M) preceding, respectively, succeeding the bipolar pair of readout magnetic field gradients.

13. The method of claim 5, wherein the reconstruction of the MR image involves a first water/fat separation based on the first single-echo image of the first set and one single-echo image of the second set resulting in a first water image and a first fat image, and a second water/fat separation based on the second single-echo image of the first set and the other single-echo image of the second set resulting in a second water image and a second fat image.

14. The MR device of claim 7, wherein the readout magnetic field gradients between consecutive refocusing RF pulses of the second shot differ from those of the first shot in gradient areas of magnetic field gradients in the readout direction (M) preceding, respectively, succeeding the bipolar pair of readout magnetic field gradients.

15. The MR of claim 7, wherein the reconstruction of the MR image involves a first water/fat separation based on the first single-echo image of the first set and one single-echo image of the second set resulting in a first water image and a first fat image, and a second water/fat separation based on the second single-echo image of the first set and the other single-echo image of the second set resulting in a second water image and a second fat image.

16. The tangible, non-transitory computer readable medium of claim 11, wherein a fat shift and/or $B_0$ distortions are corrected.

17. The method of claim 13, wherein a fat shift and/or $B_0$ distortions are corrected.

18. The method of claim 13 wherein the first and second water images are combined into a final water image, and/or the first and second fat images are combined into a final fat image.

19. The MR device of claim 15, wherein a fat shift and/or $B_0$ distortions are corrected.

20. The MR device of claim 15, wherein the first and second water images are combined into a final water image, and/or the first and second fat images are combined into a final fat image.

* * * * *